United States Patent [19]

Choksi et al.

[11] Patent Number: 4,818,711

[45] Date of Patent: Apr. 4, 1989

[54] HIGH QUALITY OXIDE ON AN ION IMPLANTED POLYSILICON SURFACE

[75] Inventors: Himanshu Choksi, Sunnyvale; Daniel Tang, San Jose, both of Calif.

[73] Assignee: Intel Corporation, Santa Clara, Calif.

[21] Appl. No.: 90,334

[22] Filed: Aug. 28, 1987

[51] Int. Cl.⁴ ............................................. H01L 21/265
[52] U.S. Cl. .......................................... 437/21; 437/24; 437/27; 437/233
[58] Field of Search ........................ 437/21, 24, 27, 28, 437/233

[56] References Cited

U.S. PATENT DOCUMENTS

| | | | |
|---|---|---|---|
| 4,172,260 | 10/1979 | Okabe et al. | 357/23.8 |
| 4,463,492 | 8/1984 | Maeguchi | 437/24 |
| 4,634,473 | 1/1987 | Swartz et al. | 437/24 |
| 4,696,092 | 9/1987 | Doering et al. | 437/5 |
| 4,697,333 | 10/1987 | Nakahara | 437/20 |
| 4,762,801 | 8/1988 | Kapoor | 437/24 |

FOREIGN PATENT DOCUMENTS

| | | | |
|---|---|---|---|
| 0208577 | 1/1987 | European Pat. Off. | 437/27 |
| 1950069 | 4/1970 | Fed. Rep. of Germany | 437/28 |
| 0146877 | 3/1981 | German Democratic Rep. | 437/24 |
| 57-159013 | 10/1982 | Japan | 437/24 |
| 58-39014 | 3/1983 | Japan | 437/27 |
| 0054217 | 3/1984 | Japan | 437/24 |

*Primary Examiner*—Olik Chaudhuri
*Attorney, Agent, or Firm*—Blakely, Sokoloff, Taylor & Zafman

[57] ABSTRACT

A method for growing a high quality oxide layer on the surface of a polysilicon film for use as an interpoly dielectric. The method comprises depositing a silicon film on a wafer and implanting the silicon film with phosphorous ions. The wafers are then sent into a diffusion tube to activate the dopant. This operation is carried out in an ambient of dry oxygen and the result is the silicon film is now polysilicon and an oxide layer has been grown on the polysilicon film. The wafers are then implanted using argon ions, the implantation is carried out through the oxide layer. The result is the surface layers of the polysilicon layer are rendered amorphous. The oxide layer grown on the polysilicon film is then removed. A new oxide layer is then grown on the polysilicon film. The result is an oxide layer with excellent physical and electrical characteristics.

21 Claims, 2 Drawing Sheets

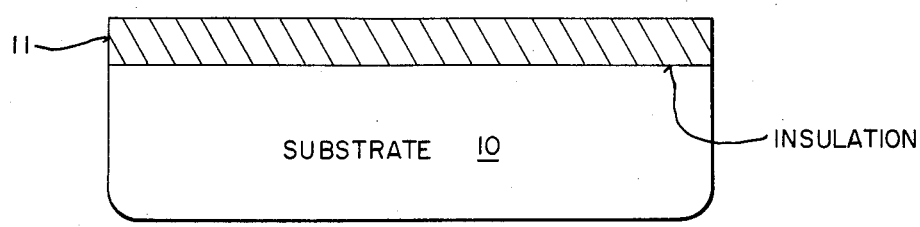
FIG_1
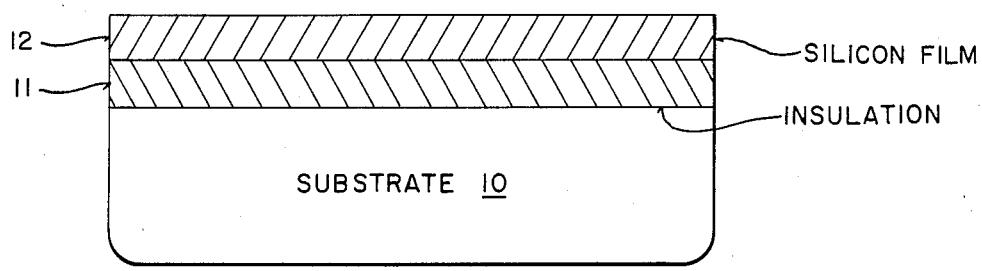
FIG_2
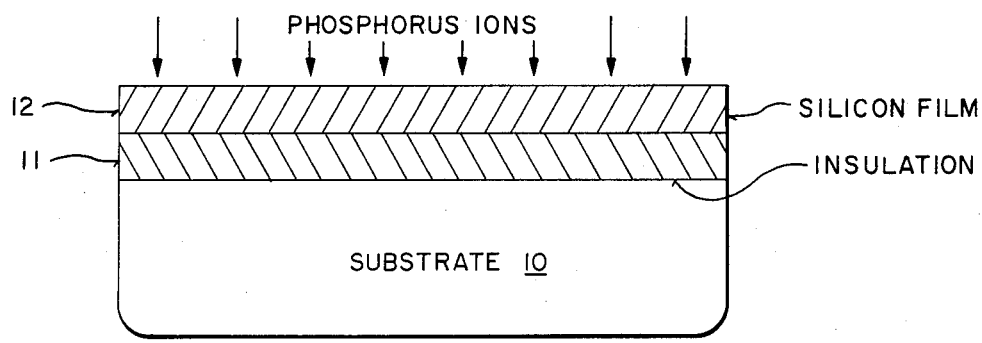
FIG_3
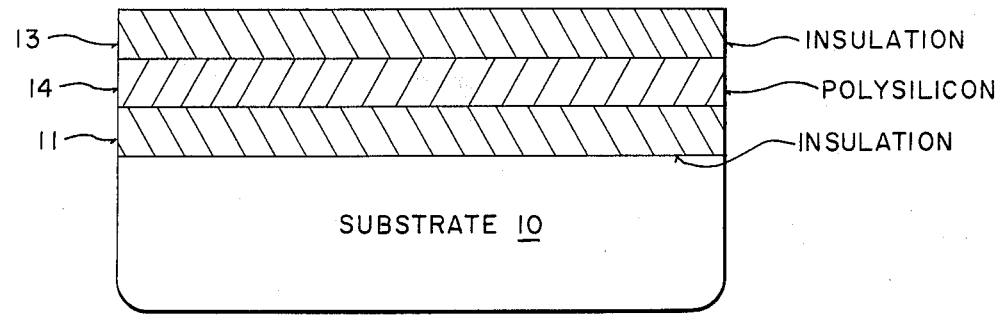
FIG_4

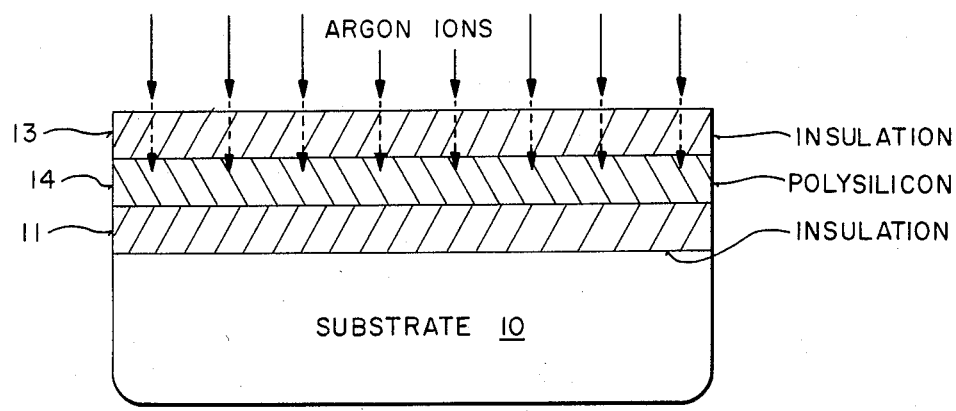
FIG_5
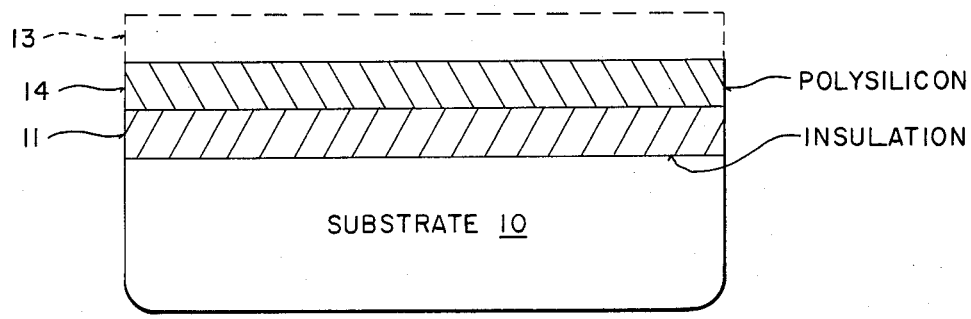
FIG_6
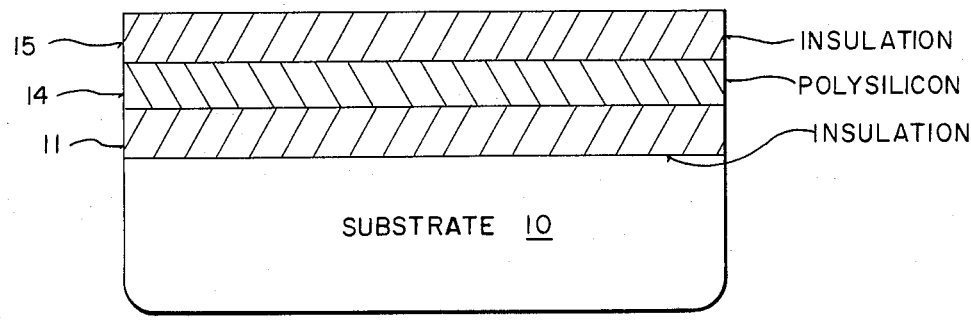
FIG_7

HIGH QUALITY OXIDE ON AN ION IMPLANTED POLYSILICON SURFACE

BACKGROUND OF THE INVENTION

1. Field of the Invention

This invention relates to the field of growing high quality oxides on the surface of ion implanted polysilicon.

2. Prior Art

In the field of growing oxide layers on the surface of polysilicon for use as an interpoly dielectric, it is desired to grow an oxide layer with improved electrical and physical characteristics. There are three generally followed methods of growing oxides on an ion implanted polysilicon layer having a variety of disadvantages.

In a first method, the polysilicon is deposited by a chemical vapor deposition (CVD) process at a temperature of above approximately 600° and diffusion doped using a gaseous (generally $POCl_3$) source. The oxide layer is then thermally grown on the film surface. This method suffers from several serious problems. First, the upper surface of the polysilicon film is rough, leading to poor electrical characteristics in the oxide layer grown on the polysilicon film due to localized field enhancement. Second, the heavy doping level leads to dopant segregtion at the grain boundaries. This leads to nonuniform oxide thickness and results in poor electrical characteristics of the oxide. Third, the quality of the oxide grown on this polysilicon film is poor due to the incorporation of phosphorous from the grain boundaries and results in a low breakdown voltage of the oxide. Fourth, the growth of the polysilicon grains through the subsequent thermal cycles causes residual stress in the oxide which reduces the breakdown voltage further.

A second method of developing the oxide layer is to deposit silicon by a CVD process at a temperature below approximately 580° C. The silicon is then diffusion doped using a gaseous (generally $POCl_3$) source. The oxide is then thermally grown on the film surface. Although low temperature deposited silicon film is initially smooth, it recrystallizes during the doping cycle resulting in very large grains. The thickness of the oxide layer grown on such a film varies from grain to grain because different crystal faces are exposed to the oxidation ambient by different grains. It is well known that different crystallographic faces oxidize at different rates. The nonuniform oxide thickness results in nonuniform electrical characteristics. In addition, the "steps" caused as a result at grain boundaries can act as charge injection sites.

A third method involves deposition of a silicon film by a CVD process above approximately 600° C. A dopant is then introduced into the film by means of an ion implantation process. The thermal oxide layer is then grown on the surface of this polysilicon film. This method also results in a rough upper surface of the polysilicon film. The oxide grown on it, therefore, has a low breakdown voltage due to localized field enhancement.

SUMMARY OF THE INVENTION

A method for growing a high quality oxide layer on the surface of an ion implanted polysilicon for use as an interpoly dielectric is described. The method involves deposition of a silicon film on an oxide layer on a silicon wafer using a chemical vapor deposition (CVD) process. The silicon film is then implanted using phosphorous ions. The wafers are sent to a diffusion tube to activate the dopant. This operation is carried out in an ambient of dry oxygen. The dopant is activated and the film is now polysilicon as a result of the recrystallization. The wafers are then implanted using argon ions. The implantation is carried out through the oxide layer. The surface layers of the polysilicon film are rendered amorphous as a result of this implant. This oxide layer is then removed and the wafer is again sent through a diffusion tube in an ambient of pure dry oxygen resulting in growing another oxide layer.

The polysilicon layer resulting from this method has a dual structure. The upper surface of the film is smooth with small equiaxed grains. The physical and electrical properties of the oxide grown on this film are, therefore, very uniform. The overall doping level is relatively low resulting in little or no dopant segregation. The lower layer of the film has very large grains and the dopant activation is high and resistivity is low.

Overall, the polysilicon film uniformity is excellent which results in reproducible electrical and physical properties.

BRIEF DESCRIPTION OF THE DRAWINGS

FIG. 1 is a cross sectional elevation view of a processing step of the preferred embodiment showing formation of an insulation layer on a semiconductor substrate.

FIG. 2 is a cross sectional elevation view of a processing step of the preferred embodiment showing formation of a silicon film on the insulation layer.

FIG. 3 is a cross sectional elevation view of a processing step of the preferred embodiment showing the silicon film being bombarded with phosphorous ions.

FIG. 4 is a cross sectional elevation view of a processing step of the preferred embodiment showing the film now being polysilicon and showing a second insulation layer grown on the film.

FIG. 5 is a cross sectional elevation view of a processing step of the preferred embodiment showing the wafer being bombarded with argon ions.

FIG. 6 is a cross sectional elevation view of a processing step of the preferred embodiment showing the second insulation layer being removed.

FIG. 7 is a cross sectional elevation view of a processing step of the preferred embodiment showing formation of a new insulation layer on the polysilicon film.

DETAILED DESCRIPTION OF THE PRESENT INVENTION

A process for formation of a high quality thermally grown oxide on the surface of an ion implanted polysilicon film for use as an interpoly dielectric is described. In the following description, numerous specific details are set forth such as processing parameters, types of materials, etc., in order to provide a thorough understanding of the present invention. It will be obvious, however, to one skilled in the art that the present invention may be practiced without these specific details. In other instances, well known structures and techniques have not been shown in detail in order not to unnecessarily obscure the present invention.

The present invention discloses a method of forming a polysilicon film which has a dual structure, the upper surface of which is smooth with small grains. This surface allows an oxide grown on the film to have excellent physical and electrical properties. The lower layer of the film has very large grains as a consequent of low temperature deposition. The dopant activation is high and resistivity is low, thus this part of the film carries the major part of any current flowing through the film. In addition, the resistivity of the polysilicon film is very uniform across the wafer and the magnitude of the resistivity is a considerably lower of that obtained by a similar implant dose into silicon deposited in the polycrystalline form. This is due to the high level of dopant activation achieved using this approach. The low resistivity results in a significant advantage in creating high density circuits.

Referring now to FIG. 1, a wafer as may be utilized by the present invention is disclosed. In the preferred embodiment, an oxide layer 11 is deposited on a single crystal silicon wafer 10 using any of a number of well known processing methods. The prior processing history of the wafer is immaterial to the present invention.

An amorphous silicon film 12 is then deposited on the oxide layer as shown in FIG. 2. The deposition of the silicon film is carried out in any commercially available chemical vapor deposition (CVD) reactor by employing a deposition temperature of approximately 560°. The thickness of the silicon film 12 depends on the application, in the preferred embodiment the silicon film is approximately 3000 angstroms thick.

The amorphous silicon film 12 is then implanted using phosphorous ions as illustrated in FIG. 3. The implantation may be done with any commercially available ion implantation machine. In the preferred embodiment the phosphorous ions are accelerated to approximately 75 keV and the flux of the ions used in the preferred embodiment is approximately 6E14/cm$^2$.

The wafers are then sent into a diffusion tube to activate the dopant. This operation is carried out in an ambient of dry oxygen at a temperature of approximately 920° C. As illustrated in FIG. 4, an oxide film 13 is grown as a result and in the preferred embodiment is approximately 280 angstroms thick. The dopant is activated and the film 14 is now polysilicon as a result of recrystallization.

As shown in FIG. 5, the wafers are then implanted using singly charged argon ions at an energy of approximately 40 keV in a flux of approximately 6E14/cm$^2$. The implantation of the argon ions is carried out through the oxide layer 13 and the surface layers of the polysilicon film 14 are rendered amorphous as a result of this implant.

The oxide layer 13 is then removed as illustrated in FIG. 6. In the preferred embodiment the oxide layer 13 is removed by dipping the wafers in a solution of 5:1 water:HF. It will be obvious to one of ordinary skill in the art that the exact ratio of water to HF may be varied and that other methods of removing the oxide layer 13 may be utilized without departing from the spirit of the invention.

The wafers are then sent through a diffusion tube and a new oxide layer is grown on the polysilicon film. In the preferred embodiment, the temperature in the diffusion tube is maintained at approximately 1000° C. and the ambient during the oxidation is pure dry oxygen.

In the preferred embodiment of the present invention, argon is chosen as the implant species because it is an inert element and, therefore, does not affect the resistivity of the film. Since argon's atomic radius is significantly different than that of silicon, incorporating argon atoms into the silicon lattice results in a large amount of strain which retards the growth of silicon grains during subsequent high temperature processing. The argon ions are implanted through the oxide layer because implanting through the oxide results in the incorporation of small amounts of oxygen atoms in the silicon lattice. The amorphous oxide film prevents any channeling effect of Argon atoms during implant and allows the implant process to produce an amorphous layer with uniform thickness. The oxygen also stabilizes the small grains up to temperatures above 1000° C. This helps to maintain the small grain size through subsequent processing.

The second oxide layer grown on the polysilicon film has extremely uniform and excellent electrical properties for several reasons. First, the amorphous polysilicon film presents random orientations to the oxidizing ambient and the oxide grown on this surface is, therefore, extremely uniform. The wave length and amplitude of any undulations in the oxide thickness is very small. Second, the method precludes the segregation of dopant (phosphorous) at grain boundaries and therefore the oxide grown on the polysilicon is of high quality. The oxide sustains higher breakdown voltage and the number and density of oxide defects is minimized.

An alternative to the preferred embodiment of the present invention consists of implantation of the argon ions without first growing the oxide layer on the polysilicon film. The polysilicon film is then implanted with oxygen atoms and an oxide layer is grown on the polysilicon film. This method still results in the incorporation of small amounts of oxygen atoms in the silicon lattice which helps to maintain the small grain size of the polysilicon film through subsequent processing.

Thus, a method for growing a high quality oxide layer on a polysilicon film for use as an interpoly dielectric is disclosed.

We claim:

1. A method for growing an insulative layer on the surface of the polysilicon film, comprising the steps of:
    depositing a silicon film with a dopant;
    activating said dopant, said silicon film becoming polysilicon as a result of said activation;
    growing a first insulative layer on said polysilicon film;
    implanting said polysilicon film with inert ions through said first insulative layer;
    removing said first insulative layer;
    growing a second insulative layer on said polysilicon film.

2. The method, as recited in claim 1, wherein said silicon film is deposited by a chemical vapor deposition (CVD) process.

3. The method, as recited in claim 2, wherein said dopant comprises phosphorous ions.

4. The method, as recited in claim 3, wherein said first insulative layer is comprised of an oxide.

5. The method, as recited in claim 4, wherein said inert ions are comprised of argon ions.

6. The method, as recited in claim 5, wherein said second insulative layer is comprised of an oxide layer.

7. The method, as recited in claim 6, wherein said silicon film is deposited at a temperature of approximately 560° C.

8. The method, as recited in claim 7, wherein said phosphorous ions are implanted by an ion implantation device;

said ion implantation device accelerating said phosphorous ions to approximately 75 keV with a flux of approximately 6E14/cm².

9. The method, as recited in claim 8, wherein said first insulative layer is grown in an ambient comprising dry oxygen at approximately 920° C.

10. The method, as recited in claim 9, wherein said argon ions are implanted by an ion implantation device;
said ion implantation device accelerating said argon ions to approximately 40 keV with a flux of approximately 6E14/cm².

11. The method, as recited in claim 10, wherein said first insulative layer is removed by a solution of water and HF.

12. The method, as recited in claim 11, wherein said solution of water and HF comprises approximately five parts water and one part HF.

13. The method, as recited in claim 12, wherein said second insulative layer is grown in an ambient comprising dry oxygen at approximately 1000° C.

14. A method for growing an oxide layer on the surface of a polysilicon film, comprising the steps of:
growing a first oxide layer on a substrate;
depositing a silicon film on said first oxide layer;
doping said silicon film with phosphorous ions;
activating said phosphorous ion dopant, said silicon film becoming polysilicon as a result of said activation;
growing a second oxide layer on said polysilicon film simultaneous with said activation of said dopant;
implanting said film with argon ions through said second oxide layer, said film becoming amorphous as a result of said implantation of argon ions;
removing said second oxide layer;
growing a third oxide layer on said amorphous polysilicon film;
whereby, said third oxide layer has uniform physical and electrical properties.

15. The method, as recited by claim 14, wherein said silicon film is deposited by a chemical vapor deposition (CVD) process at approximately 560°.

16. The method, as recited by claim 15, wherein said phosphorous ions are implanted with an ion implantation device;
said ion implantation device accelerating said phosphorous ions to approximately 70 keV with a flux of approximately 6E14/cm².

17. The method, as recited by claim 16, wherein said second oxide layer is grown in an ambient of dry oxygen at approximately 920° C.

18. The method, as recited by claim 17, wherein said argon ions are implanted by an ion implantation device;
said ion implantation device accelerating said argon ions to approximately 40 keV with a flux of approximately 6E14/cm².

19. The method, as recited by claim 18, wherein said second insulative layer is removed by a solution comprised of approximately five parts water and one part HF.

20. The method, as recited by claim 19, wherein said second insulative layer is grown in an ambient comprising dry oxygen at approximately 1000° C.

21. A method for growing an oxide layer on the surface of a polysilicon film, comprising:
growing a first oxide layer on a substrate;
depositing a silicon film on said first oxide layer;
doping said silicon film with phosphorous ions, said silicon film becoming polysilicon as a result of said doping;
doping said polysilicon film with argon
doping said polysilicon film with oxygen;
growing a second oxide layer on said polysilicon film;
whereby, said polysilicon layer has oxygen atoms incorporated into the silicon lattice and said second oxide layer has uniform physical and electrical properties.

* * * * *

UNITED STATES PATENT AND TRADEMARK OFFICE
CERTIFICATE OF CORRECTION

PATENT NO. : 4,818,711

DATED : 4/4/89

INVENTOR(S) : Choksi et al.

It is certified that error in the above-identified patent and that said Letters Patent is hereby corrected as shown below:

col. 01, line 27     delete "segregtion"     insert --segregation-- col. 06, line 32     after "argon"     insert --ions;--

Signed and Sealed this

Twenty-eighth Day of May, 1991

Attest:

HARRY F. MANBECK, JR.

Attesting Officer     Commissioner of Patents and Trademarks